(12) United States Patent
Islam et al.

(10) Patent No.: US 7,139,189 B2
(45) Date of Patent: Nov. 21, 2006

(54) STATE-RETENTIVE MIXED REGISTER FILE ARRAY

(75) Inventors: Rabiul Islam, Austin, TX (US); Joseph Hong, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 202 days.

(21) Appl. No.: 10/948,675

(22) Filed: Sep. 24, 2004

(65) Prior Publication Data

US 2006/0072356 A1  Apr. 6, 2006

(51) Int. Cl.
*G11C 11/00* (2006.01)
(52) U.S. Cl. ............... 365/154; 365/227; 365/229; 365/230.05
(58) Field of Classification Search .......... 365/154, 365/227, 229, 230.05
See application file for complete search history.

(56) References Cited

U.S. PATENT DOCUMENTS

| | | | |
|---|---|---|---|
| 6,580,657 B1 * | 6/2003 | Sanford et al. | 365/230.05 |
| 6,888,202 B1 * | 5/2005 | Kang et al. | 257/391 |
| 6,958,948 B1 * | 10/2005 | Shiraishi | 365/230.05 |
| 6,985,379 B1 * | 1/2006 | Nii | 365/154 |

* cited by examiner

*Primary Examiner*—Hoai V. Ho
(74) *Attorney, Agent, or Firm*—Venable LLP; Jeffrey W. Gluck

(57) ABSTRACT

A storage cell having a storage circuit and a readout circuit may be used in power-saving environments, where the storage circuit may be maintained in an ultra-drowsy mode during power-saving periods while the readout circuit may be powered down during power-saving periods. A pull-down transistor may be incorporated into the readout circuit to reduce current leakage during power-saving periods.

13 Claims, 3 Drawing Sheets

STATE-RETENTIVE MIXED REGISTER FILE ARRAY

BACKGROUND OF THE INVENTION

In many devices, for example, in battery-powered devices, power saving methods may be employed. Such power saving methods often involve powering down at least some portion of the device. When portions of a device are powered down, state-retentive memories may be useful in order to preserve data (for example, but not limited to a system state). A problem that has plagued such state-retentive memories is current leakage, which may result in wasted power in portions of the device that are not powered down or not fully powered down.

BRIEF DESCRIPTION OF THE DRAWINGS

Various embodiments of the invention will now be described in connection with associated drawings, in which.

DETAILED DESCRIPTION OF EMBODIMENTS OF THE INVENTION

In the following description, numerous specific details are set forth. However, it is understood that embodiments of the invention may be practiced without these specific details. In other instances, well-known circuits, structures, and/or techniques have not been shown in detail in order not to obscure an understanding of this description.

References to "one embodiment", "an embodiment", "example embodiment", "various embodiments", etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Figure 1:
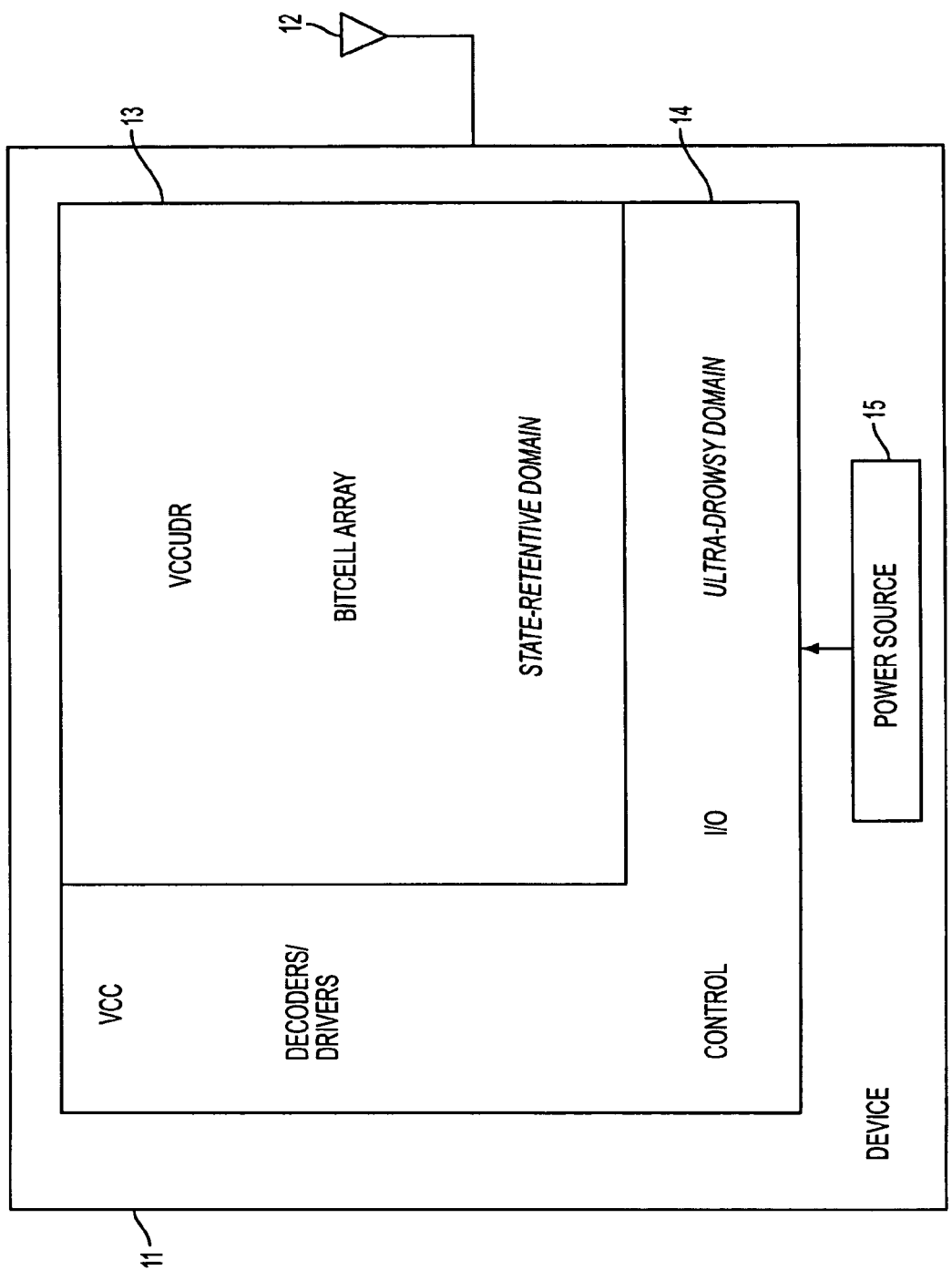
FIG. 1 depicts a block diagram of a device that may include an embodiment of the invention.

FIG. 1 shows a device according to an embodiment of the invention. In the embodiment of FIG. 1, a device 11 may be equipped with various components 12–15. Device 11 may be, for example, but is not limited to, a mobile telephone, a personal digital assistant (PDA), a mobile computing platform, or other mobile or stationary device.

Device 11 may include an antenna 12. Antenna 12 may include, for example, but is not limited to, a monopole antenna, a dipole antenna, and an antenna array.

Device 11 may also include a power source 15. Power source 15 may be, but is not limited to, a rechargeable battery or a non-rechargeable battery. Power source 15 may be used to provide power to other components of the device 11.

Device 11 may further include various circuit components. According to embodiments of the invention, the circuit components may comprise two or more power domains, shown as an ultra-drowsy domain 14 that is powered by a first power source and a state-retentive domain 13 that is powered by a second power source. The ultra-drowsy domain 14 may include the portions of the circuit powered by $V_{CC}$, which may be powered down completely (collapsed) while the device 11 is in one or more power saving modes. Domain 14 may include, for example, but is not limited to, decoders and drivers, control hardware, and input/output (I/O) hardware. The state-retentive domain 13 may include portions of the circuit powered by $V_{CC\_UDR}$, a voltage that may be lowered to reduce power consumption while device 11 is in one or more power saving modes, but still maintained high enough for the circuitry to maintain state. For example, domain 13 may include, but is not limited to, memory storing information that should be retained during the low power state, such as system states.

During periods of inactivity, for example, device 11 may be able to enter a power saving mode. One such power saving mode, for example, may be defined to require that the state of some portions of the logic (such as memory containing executable code and related data) may be preserved intact, while the state of other portions of the logic (such as control circuitry) may be lost and reconstructed or reset upon resumption of operational power. Therefore, a power source $V_{CC}$ of one domain 14 may be collapsed (e.g., shut off completely or dropped to zero volts), while a power source $V_{CC\_UDR}$ of another domain 13 may be maintained or only partially reduced ($V_{CC\_UDR}$ may thus be referred to as a "non-collapsible" power source, although various embodiments of the invention are not limited to power supplies using that terminology). In some embodiments of the invention, $V_{CC}$ and $V_{CC\_UDR}$ may be at the same voltage during normal periods of operation, although embodiments of the invention are not limited in this respect.

Figure 2:
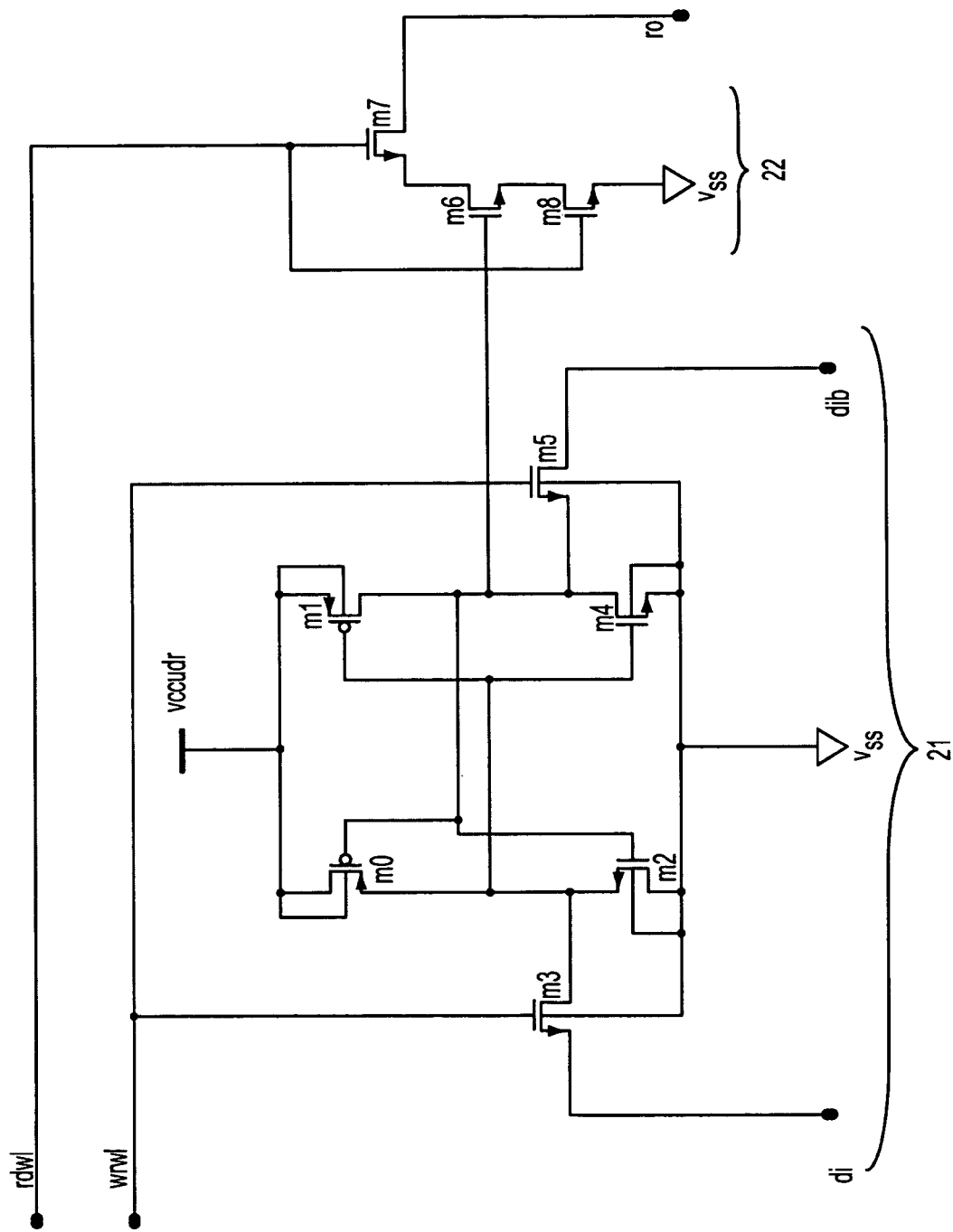
FIG. 2 depicts a circuit diagram of an exemplary embodiment of the invention.

FIG. 2 shows a circuit diagram of a state-retentive memory cell according to an embodiment of the invention. Such a memory cell may be used, for example, in a device 11 that is able to operate in an power-saving mode in which some parts of device 11 are powered down completely while other parts of device 11 remain powered, possibly at a lower voltage level than during operation but at a sufficient voltage level to maintain state. Shown in FIG. 2 are a bit storage cell comprising a storage circuit 21, powered by a non-collapsible power source $V_{CC\_UDR}$, and associated readout circuitry 22, which may be powered by a collapsible power source $V_{CC}$.

The storage circuit 21 may, for example, comprise transistors m0, m1, m2, m3, m4, and m5; though other configurations may also be used. According to an embodiment of the inventions, these transistors may comprise thick-gate transistors. A thick-gate transistor may generally have a relatively high threshold voltage ($V_t$) and a longer channel length and a thicker gate than a typical thin-gate transistor. When compared to other circuit designs, the use of thick-gate transistors may provide better state retention and stability at reduced voltage levels (e.g., voltage levels as low as 0.65 volts), while the high $V_t$ may reduce leakage during a state retentive mode.

Readout circuitry 22 may comprise transistors m6, m7, and m8. According to an embodiment of the invention, transistors m6, m7, and m8 may comprise thin-gate, low-threshold-voltage transistors. These thin-gate transistors may generally have a thinner gate and lower threshold voltage than the above-described thick-gate transistors. As a result, the readout circuitry 22 may be able to carry out a high-speed read operation during a normal mode of operation, as a lower applied gate voltage (compared with thick-gate transistors) may be used to cause such a transistor to turn "on," thus resulting in greater sensitivity and associated switching speed than with thick-gate transistors.

During operation, with both $V_{CC}$ and $V_{CC\_UDR}$ at operational levels, a write operation may place the proper signal levels on wrwl, di, and dib, so that either a logic '0' or a logic '1' is stored in the circuitry comprising m0, m1, m2, and m4. A read operation may place the proper signal level on rdwl to convey that stored logic state to signal line ro through m6 and m7.

According to some embodiments of the invention, as shown in FIG. 2, the read channel may be equipped with a pull-down transistor m8. Without m8, during power saving mode, a voltage level being stored in the storage circuit 21 may be applied to the gate of the otherwise unpowered m6, which may result in current leakage from the powered storage circuit 21, through m6 to $V_{SS}$. To prevent this, or at least reduce the amount of leakage, pull-down transistor m8 may be interposed between m6 and $V_{SS}$. In power saving mode, the read line (rdwl) may be zero, as it may be supplied from $V_{CC}$, and hence, m8 is turned "off," which may effectively provide a high resistance connection between m6 and $V_{SS}$, greatly reducing the leakage current. $V_{SS}$ may be a ground potential in some embodiments, although not all embodiments of the invention are limited in this respect.

Figure 3:
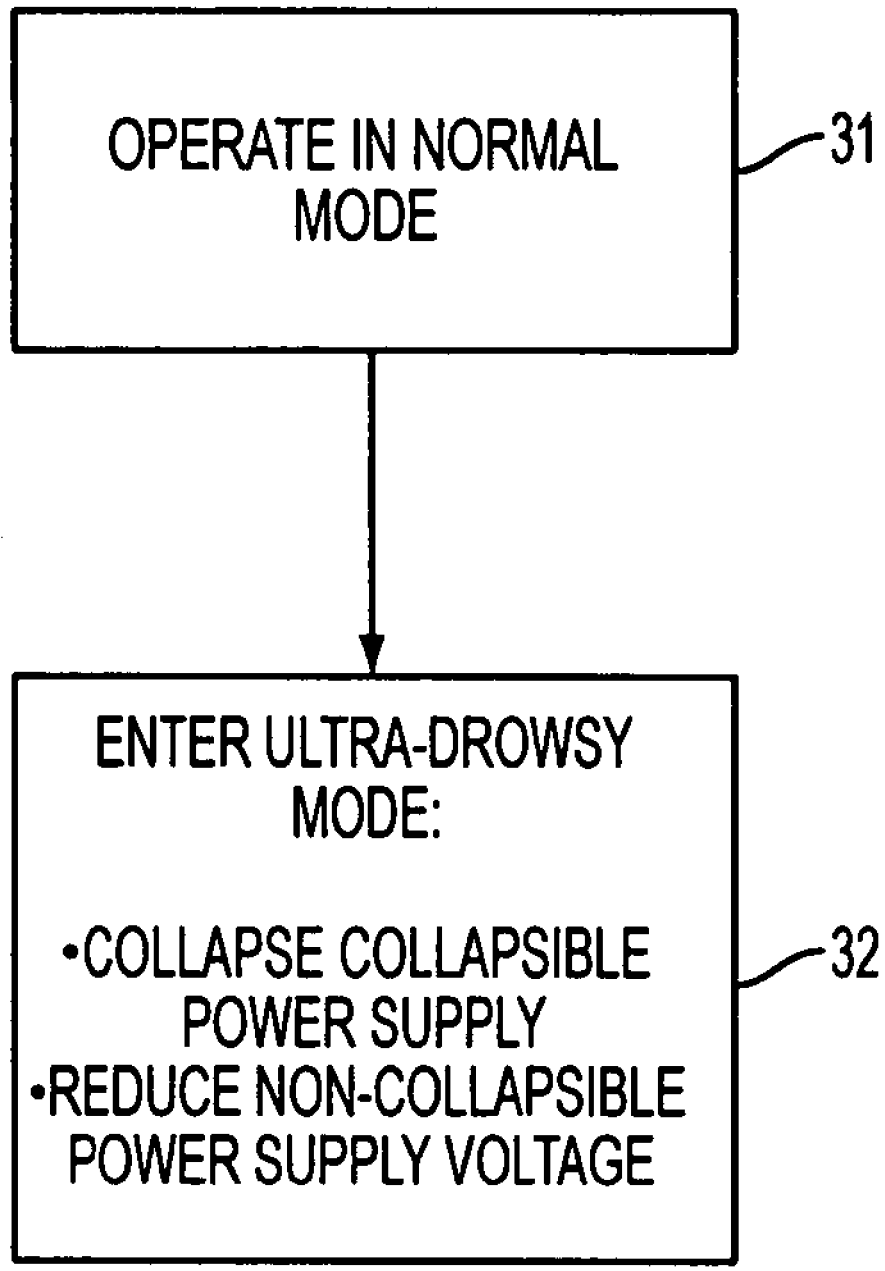
FIG. 3 depicts a flowchart of a method according to an embodiment of the invention.

FIG. 3 depicts a flowchart of a method according to an exemplary embodiment of the invention. A device, which may include a storage cell according to an embodiment of the present invention, may initially operate in a normal, full-power mode 31. Upon appropriate control procedures (not shown), the device may then enter a reduced-power mode, which may be an ultra-drowsy mode 32. This may, for example, involve collapsing a collapsible power supply, and may further involve, for example, reducing a non-collapsible power supply voltage.

The invention has been described in detail with respect to various embodiments, and it will now be apparent from the foregoing to those skilled in the art that changes and modifications may be made without departing from the invention in its broader aspects. The invention, therefore, as defined in the appended claims, is intended to cover all such changes and modifications as fall within the true spirit of the invention.

What is claimed is:

1. An apparatus, comprising:
a bit storage cell comprising:
   a storage circuit to be powered by a non-collapsible power source; and
   a readout circuit to be powered by a collapsible power source and coupled to said storage circuit, the readout circuit having a first transistor disposed in a leakage path from the storage circuit during a power-saving mode, the first transistor having a gate coupled to the collapsible power source,
wherein said readout circuit further comprises a second transistor having a gate coupled to the storage circuit, the first transistor coupled between the second transistor and a ground connection of the collapsible power source.

2. The apparatus according to claim 1, wherein said collapsible power source and said non-collapsible power source are maintained at a common voltage level during a non-power-saving mode.

3. The apparatus according to claim 2, wherein, in a power-saving mode of operation, said collapsible power source voltage is set essentially to zero, while said non-collapsible power source voltage is set to a voltage less than said common voltage level.

4. The apparatus according to claim 1, wherein said storage circuit comprises at least one thick-gate transistor, and wherein said readout circuit comprises at least one thin-gate transistor.

5. A system comprising:
a bit storage cell comprising:
   a storage circuit to be powered by a non-collapsible power source; and
   a readout circuit to be powered by a collapsible power source and coupled to said storage circuit, the readout circuit having a first transistor disposed in a leakage path from the storage circuit during a power-saving mode, the first transistor having a gate coupled to the collapsible power source; and
a battery coupled to at least one of the group consisting of said storage circuit and said readout circuit,
wherein said readout circuit further comprises a second transistor having a gate coupled to the storage circuit, the first transistor coupled between the second transistor and a ground connection of the collapsible power source.

6. The system according to claim 5, wherein said battery comprises a rechargeable battery.

7. The system according to claim 5, wherein said collapsible power source and said non-collapsible power source are maintained at a common voltage level during a non-power-saving mode.

8. The system according to claim 7, wherein, in a power-saving mode of operation, said collapsible power source voltage is set essentially to zero, while said non-collapsible power source voltage is set to a voltage less than said common voltage level.

9. The apparatus according to claim 5, wherein said storage circuit comprises at least one thick-gate transistor, and wherein said readout circuit comprises at least one thin-gate transistor.

10. A method comprising:
operating in a first mode a bit storage cell including a storage circuit powered by a non-collapsible power source and a readout circuit powered by a collapsible power source and coupled to said storage circuit, the readout circuit having a first transistor disposed in a leakage path from the storage circuit during a second mode, the first transistor having a gate coupled to the collapsible power source, said readout circuit also having a second transistor having a gate coupled to the storage circuit, the first transistor coupled between the second transistor and a ground connection of the collapsible power source; and
entering said second mode, comprising collapsing said collapsible power source.

11. The method according to claim 10, said entering said second mode further comprising:
reducing a voltage of said non-collapsible power source.

12. The method according to claim 10, said operating in a first mode comprising:
maintaining said collapsible power source and said non-collapsible power source at a common voltage level.

13. The method according to claim 12, said entering said second mode further comprising:
setting said non-collapsible power source to a voltage level less than said common voltage level.

* * * * *